(12) United States Patent
Sonsky et al.

(10) Patent No.: US 10,134,860 B2
(45) Date of Patent: Nov. 20, 2018

(54) SEMICONDUCTOR DEVICE HAVING A DIELECTRIC LAYER WITH DIFFERENT THICKNESSES AND METHOD FOR FORMING

(71) Applicant: NXP B.V., Eindhoven (NL)

(72) Inventors: Jan Sonsky, Leuven (BE); Viet Thanh Dinh, Leuven (BE); Jan Claes, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/456,963

(22) Filed: Mar. 13, 2017

(65) Prior Publication Data

US 2018/0261676 A1    Sep. 13, 2018

(51) Int. Cl.
*H01L 29/78*   (2006.01)
*H01L 29/423*  (2006.01)
*H01L 29/66*   (2006.01)

(52) U.S. Cl.
CPC .. *H01L 29/42368* (2013.01); *H01L 29/66484* (2013.01); *H01L 29/66507* (2013.01); *H01L 29/7831* (2013.01); *H01L 29/7833* (2013.01); *H01L 29/7845* (2013.01)

(58) Field of Classification Search
CPC ......... H01L 29/42368; H01L 29/66507; H01L 29/66484; H01L 29/7831; H01L 29/7833; H01L 29/7845
See application file for complete search history.

(56) References Cited

U.S. PATENT DOCUMENTS

| 4,885,617 | A  | * | 12/1989 | Mazure-Espejo ............... H01L 21/2257 257/384 |
| 7,405,443 | B1 | * | 7/2008  | Zuniga .................. H01L 29/402 257/328 |
| 7,608,513 | B2 |   | 10/2009 | Yang et al. |
| 7,910,441 | B2 |   | 3/2011  | Yang et al. |
| 8,203,188 | B2 | * | 6/2012  | Ito ....................... H01L 29/7835 257/406 |

(Continued)

OTHER PUBLICATIONS

Bianchi, R. et al., "High voltage devices in advanced CMOS technologies", IEEE 2009 Custom Integrated Circuits Conference (CICC), pp. 363-369.

(Continued)

*Primary Examiner* — Kyoung Lee
*Assistant Examiner* — Christina Sylvia

(57) ABSTRACT

A semiconductor device includes a first dielectric layer on a substrate, the first dielectric layer including a first dielectric portion over a first doped well region of a first conductivity type and a second dielectric portion over a second doped well region of a second conductivity type, and a second dielectric layer on the substrate directly adjacent the first dielectric layer. The second dielectric layer is over the second doped well region. A first conductive gate structure is over the first and second dielectric layers. A third dielectric layer is on the substrate over the second doped well region and separated a first distance from the second dielectric layer. A second conductive gate structure is over the third dielectric layer. A third doped region of the second conductivity type is implanted in the second doped well region a second distance from the third dielectric layer and the second conductive gate structure.

18 Claims, 14 Drawing Sheets

(56) References Cited

U.S. PATENT DOCUMENTS

| | | |
|---|---|---|
| 9,614,041 B1 | 4/2017 | Zhang et al. |
| 2003/0141559 A1* | 7/2003 | Moscatelli ........ H01L 21/28167 257/406 |
| 2006/0244099 A1* | 11/2006 | Kurjanowicz ......... G11C 17/16 257/530 |
| 2011/0079848 A1 | 4/2011 | Sonsky et al. |
| 2011/0260247 A1* | 10/2011 | Yang ................... H01L 29/0653 257/343 |

OTHER PUBLICATIONS

Li, M. et al., "An Optimized Isolated 5V EDMOS in 55nm LPx Platform for Use in Power Amplifier Applications", 2016 IEEE Radio Frequency Integrated Circuits Symposium, pp. 107-109.

\* cited by examiner

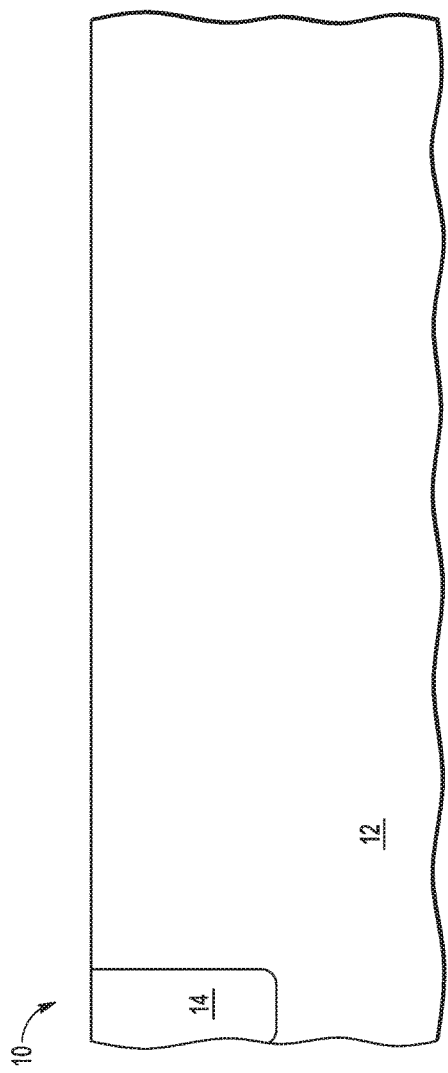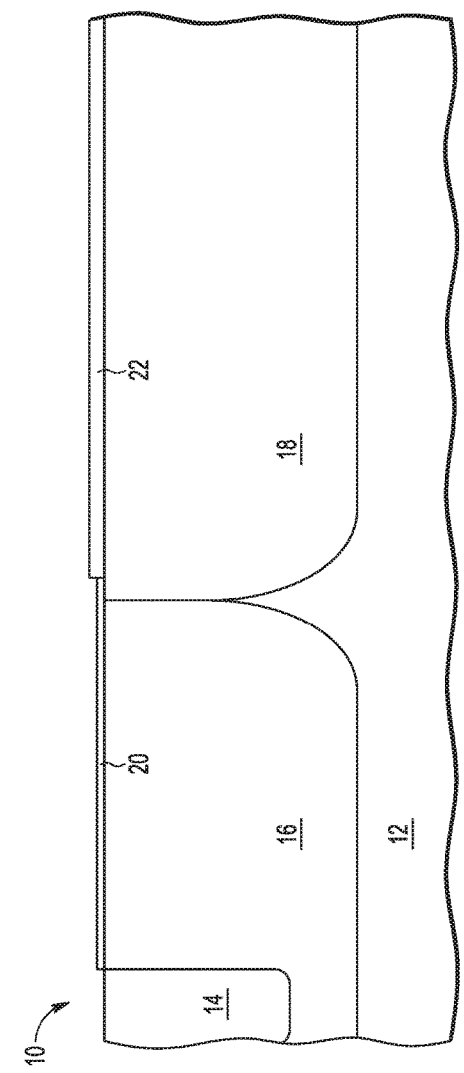

SEMICONDUCTOR DEVICE HAVING A DIELECTRIC LAYER WITH DIFFERENT THICKNESSES AND METHOD FOR FORMING

BACKGROUND

Field

This disclosure relates generally to semiconductor processing, and more specifically, to a semiconductor devices having a dielectric layer with different thicknesses and method for forming.

Related Art

Complementary metal-oxide-semiconductor (CMOS) technology typically includes logic transistors and input/output (I/O) transistors. Each are designed with factors which enable better operation for their use. For example, logic transistors tend to have thinner gate dielectrics and a reduced operating voltage for high performance, as compared to I/O transistors, which tend to have thicker gate dielectrics and a high operating voltage to interface with higher external voltages and higher power. Logic transistors, with their smaller gate-length, enable better radio-frequency (RF) operation with high enough cut-off frequency (e.g. above 100 GHz). However, with their limited operating voltage, usage of logic transistors to deliver high power for RF applications is not possible as such a design would occupy too much silicon area and the total device width would result in a too large input capacitance thus limiting the achievable operating frequency. Therefore, a need exists for an improved semiconductor device for achieving good RF performance at higher power levels.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 1-9 illustrate, in cross-section form, a semiconductor device at various processing stages, in accordance with one embodiment of the present invention.

DETAILED DESCRIPTION

Figure 3:
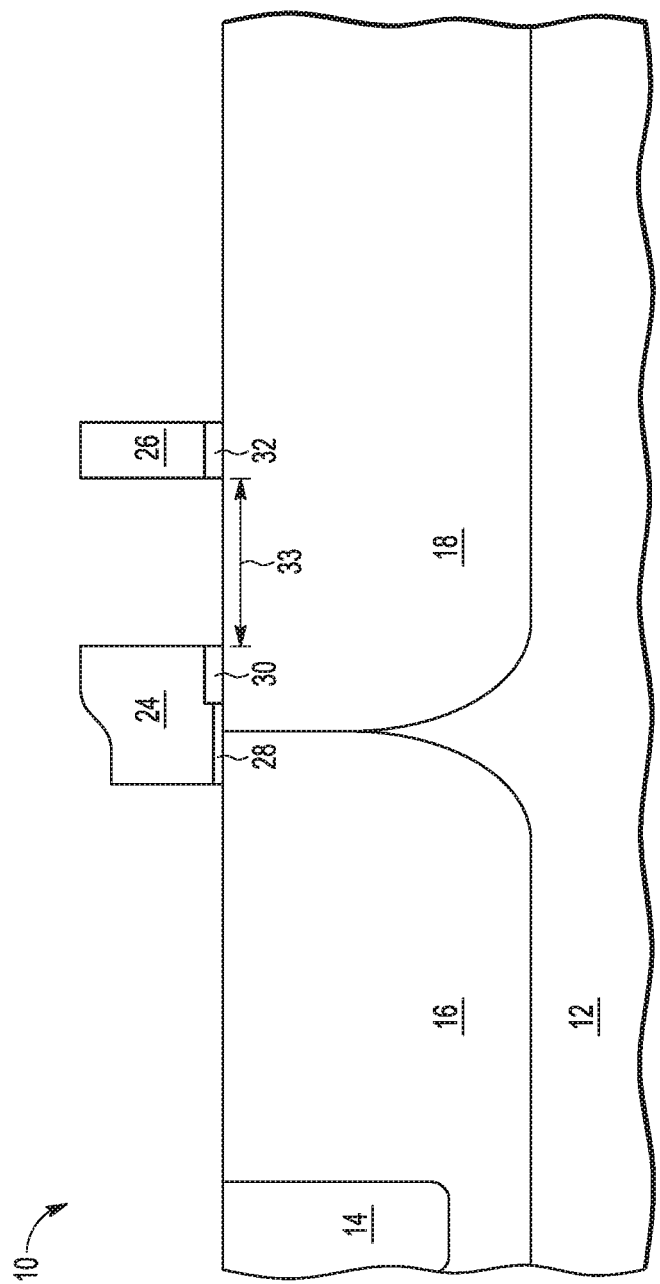

In one embodiment, an RF power transistor with good RF performance has a high current density, a high cut-off frequency, and a maximum operating frequency similar to that of a logic transistor, but with extended operating voltage. The RF power transistor, as will be described below, uses an extended drain region and dual gate dielectrics of different thicknesses. Also, in one embodiment, the device includes two separate gates, a primary gate and a secondary gate, in which the transition from thin to thick gate dielectric is either under the primary gate or in the region between the two gates, depending on the desired device performance.

FIG. 1 illustrates a cross-sectional view of a semiconductor device 10 having a semiconductor substrate 12 and an isolation region 14. Substrate 10 can be any semiconductor material or combinations of material such as silicon, silicon germanium, gallium arsenide, or the like. Isolation region 14 may be a shallow trench isolation (STI) region and is generally formed between neighboring devices. In one embodiment, isolation region 14 includes an oxide. In one embodiment, device 10 is formed as an N-channel device, and thus FIGS. 1-9 will be described in reference to an N-channel device with the appropriate polarity or conductivity types. However, the same process may be used to form a P-channel device with the reverse polarity or conductivity types.

FIG. 2 illustrates a cross-sectional view of semiconductor device 10 at a subsequent stage in processing. Wells 16 and 18 (also referred to as doped well regions) are formed in substrate 12. In one embodiment, well 16 is a P-type well and well 18 is an N-type well. Dielectric layers 20 and 22 are formed over substrate 12. Dielectric layers 20 and 22 may be oxides, and may be grown or deposited, or a combination thereof. An intermediate patterning step is applied to ensure that dielectric layer 20 extends over well 16 and a portion of well 18, such that dielectric layer 20 meets dielectric layer 22 over well 18. Dielectric layer 22 is thicker than dielectric layer 20. Any suitable methods may be used to form layers 20 and 22, in which the formation of either of these layers may include the formation of multiple layers, either by growth or deposition.

FIG. 3 illustrates a cross-sectional view of semiconductor device 10 at a subsequent stage in processing. A gate layer is deposited over substrate 12 and pattered to form conductive gate structures 24 and 26. When portions of the gate layer are removed to form conductive gate structure 24 and 26, portions of dielectric layers 20 and 22 not under gate structures 24 and 26 are also removed. In this manner, a portion of dielectric layer 20, referred to as gate dielectric layer 28, remains between a first portion of gate structure 24 and substrate 12, and a portion of dielectric layer 22, referred to as gate dielectric layer 30, remains between a second portion of gate structure 24 and substrate 12. Note that gate dielectric layers 28 and 30 together form a contiguous gate dielectric layer between gate structure 24 and substrate 12. The contiguous gate dielectric layer includes 2 different thicknesses, a thinner portion and a thicker portion since dielectric layer 22 is thicker than dielectric layer 20. A portion of dielectric layer 22, referred to as gate dielectric layer 32, remains between gate structure 26 and substrate 12. Gate dielectric layer 32 is also thicker than gate dielectric layer 28 since it is formed from dielectric layer 22. Gate structure 26 is physically separate and spaced apart from gate structure 24 by a distance 33 and is located entirely over well 18. In contrast, gate structure 24 is located over both wells 16 and 18. In one embodiment, distance 33 is in range of 100 to 500 nanometers.

Figure 4:
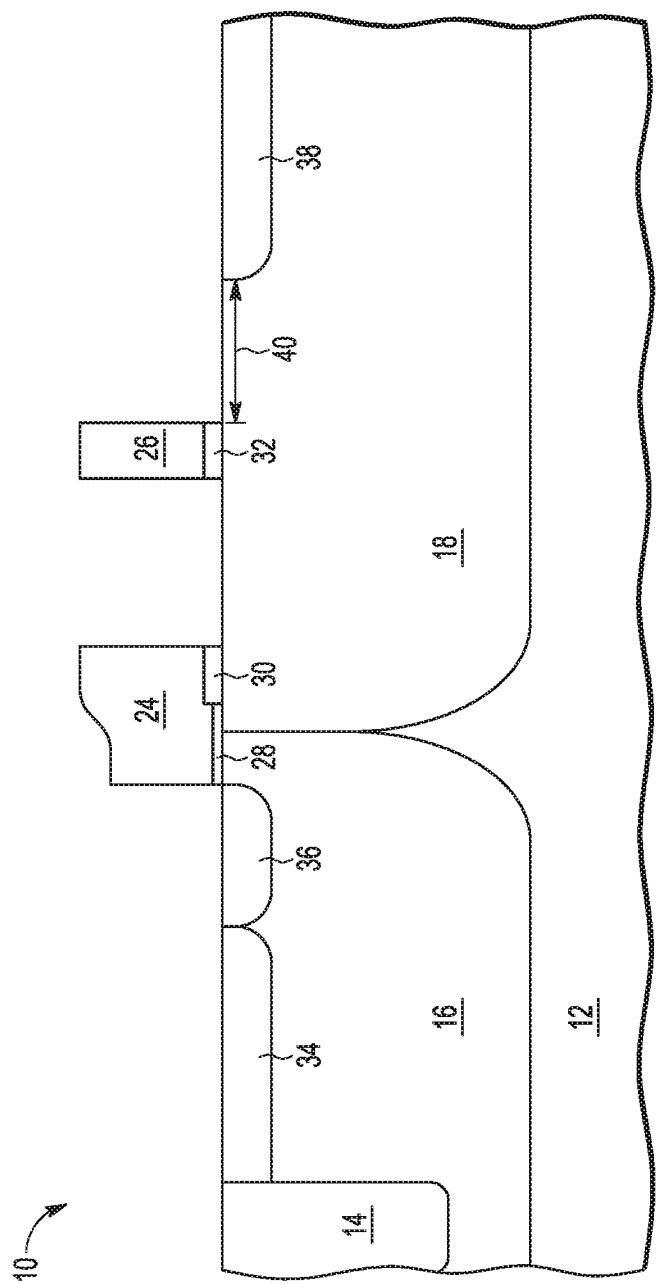

FIG. 4 illustrates a cross-sectional view of semiconductor device 10 at a subsequent stage in processing. Shallow implants are performed into substrate 12 to form doped regions 34 and 36 in well 16 and doped region 38 in well 18. In one embodiment, region 34 is a heavily doped P+ region, and regions 36 and 38 are heavily doped N+ regions. That is, region 34 has a greater doping level than well 16, and regions 36 and 38 have a greater doping level than well 18. Regions 34, 36, and 38 can be formed using, for example, lightly-doped-drain (LDD) implants or a combination of LDD implants with opposite doping-type implants. Note that a patterned masking layer is used for the implants to form region 34 and to form regions 36 and 38 in the desired locations. Regions 36 and 38 may be formed before or after the formation of region 34. Region 38 is laterally spaced from gate structure 26 by a distance 40 In one embodiment, distance 40 is in a range of 100 to 1000 nanometers. Note that distance 40 can be obtained in any suitable way, such as, for example, by mask design and lithography definition, or by providing "hardmasks" such as dielectric spacers adjacent gate structure 26. In an alternate embodiment, regions 34 and 38 are not present.

Figure 5:
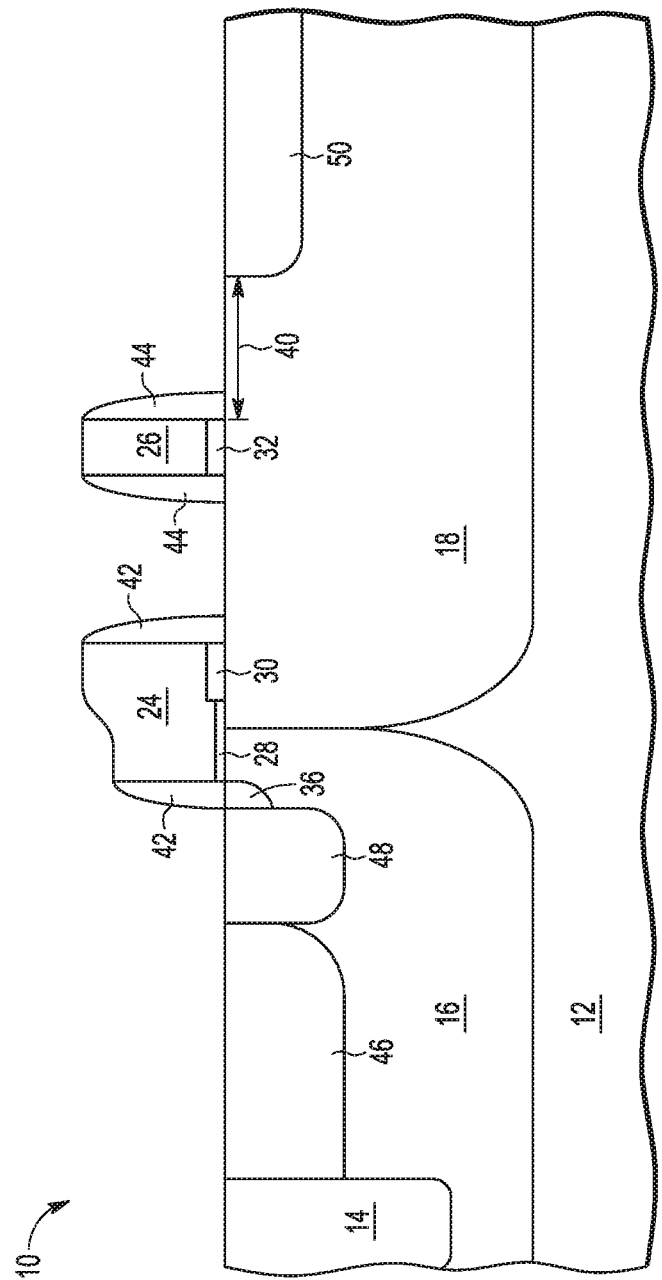

FIG. 5 illustrates a cross-sectional view of semiconductor device 10 at a subsequent stage in processing. A spacer 42 is formed around gate structure 24 and a spacer 44 is formed around gate structure 26. Further implants are performed into substrate 12 to form doped regions 46, 48, and 50. Doped region 46 is formed at the same location as region 34 but extends further into substrate 12 and is a heavily doped P++ region (more heavily doped than region 34). Doped region 48 is formed at the same location as region 36 but adjacent spacer 42, therefore a portion of region 36 under spacer 42 remains. That is, spacer 42 masks the implant during formation of region 48. Also, region 48 extends further into substrate 12 than region 36 and is a heavily doped N++ region (more heavily doped than region 36). Doped region 50 is formed at the same location as region 38 but extends further into substrate 12 and is a heavily doped N++ region (more heavily doped than region 38). Doped regions 48 and 36 correspond to a source region of device 10 and doped region 50 to a drain region of device 10. Doped region 46 corresponds to the body of device 10. In one embodiment, a portion of gate structure 24, such as only the source side portion of gate structure 24 is heavily doped to N+. As with regions 34, 36, and 38, a patterned masking layer is used for the implants to form the doped regions in the desired locations.

Figure 6:
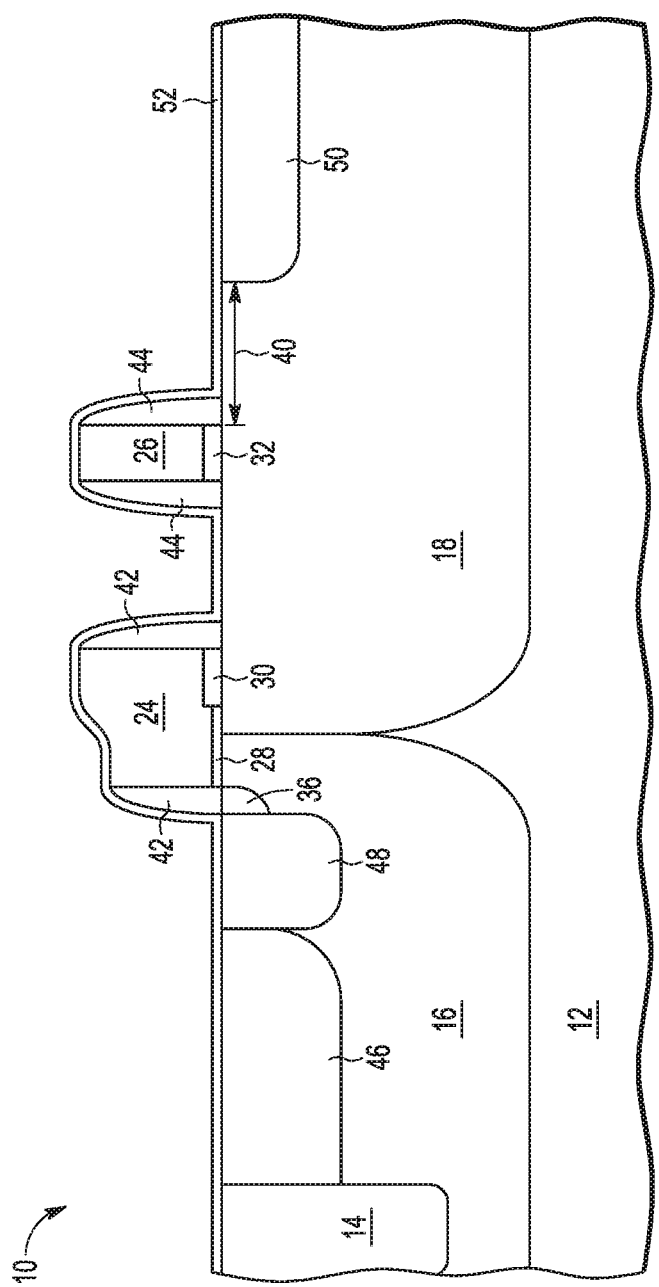

FIG. 6 illustrates a cross-sectional view of semiconductor device 10 at a subsequent stage in processing. A dielectric layer 52 is formed over substrate 12 and gate structures 24 and 26. In one embodiment, dielectric layer 52 is an insulator, such as oxide, and is blanket deposited over substrate 12.

Figure 7:
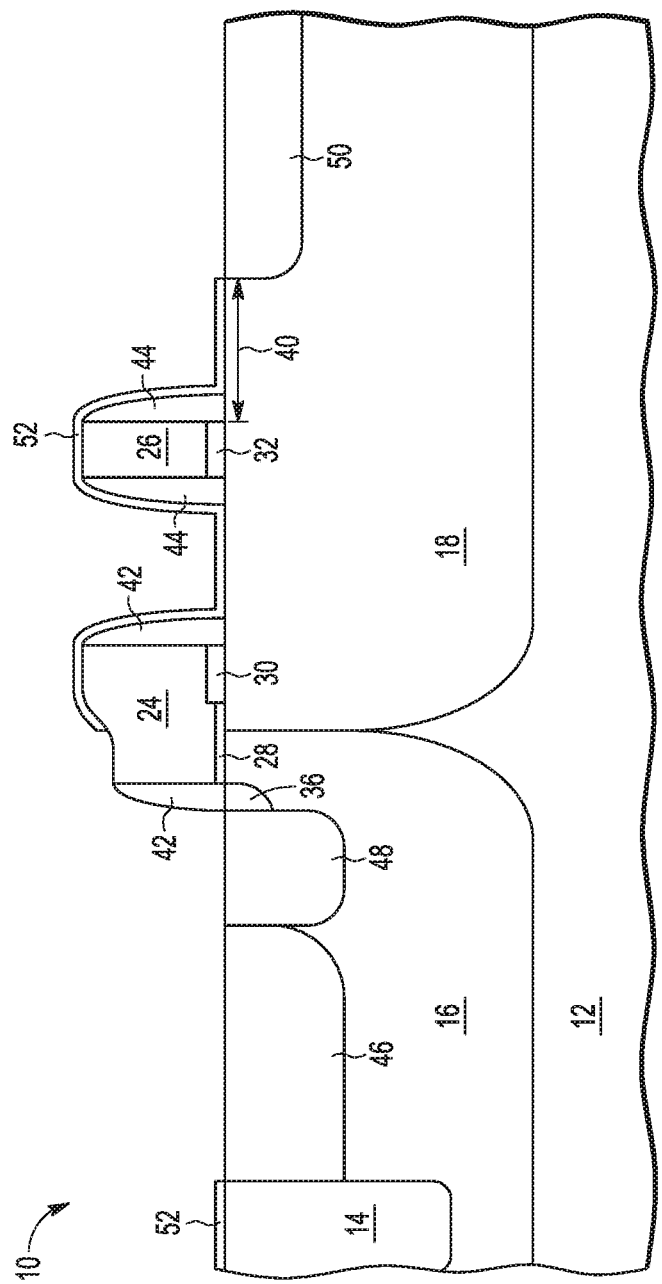

FIG. 7 illustrates a cross-sectional view of semiconductor device 10 at a subsequent stage in processing. Dielectric layer 52 is patterned to remove portions from locations where a silicide layer is desired. Therefore, portions of dielectric layer 52 are removed from over doped regions 46 and 48, part of spacer 42 and part of gate structure 24 (on the source side), and from over doped region 50, leaving dielectric layer 52 over isolation region 14, part of gate structure 24 and spacer 42, substrate 12 between gate structures 24 and 26, spacer 44, gate structure 26, and substrate 12 between spacer 44 and doped region 50.

Figure 8:
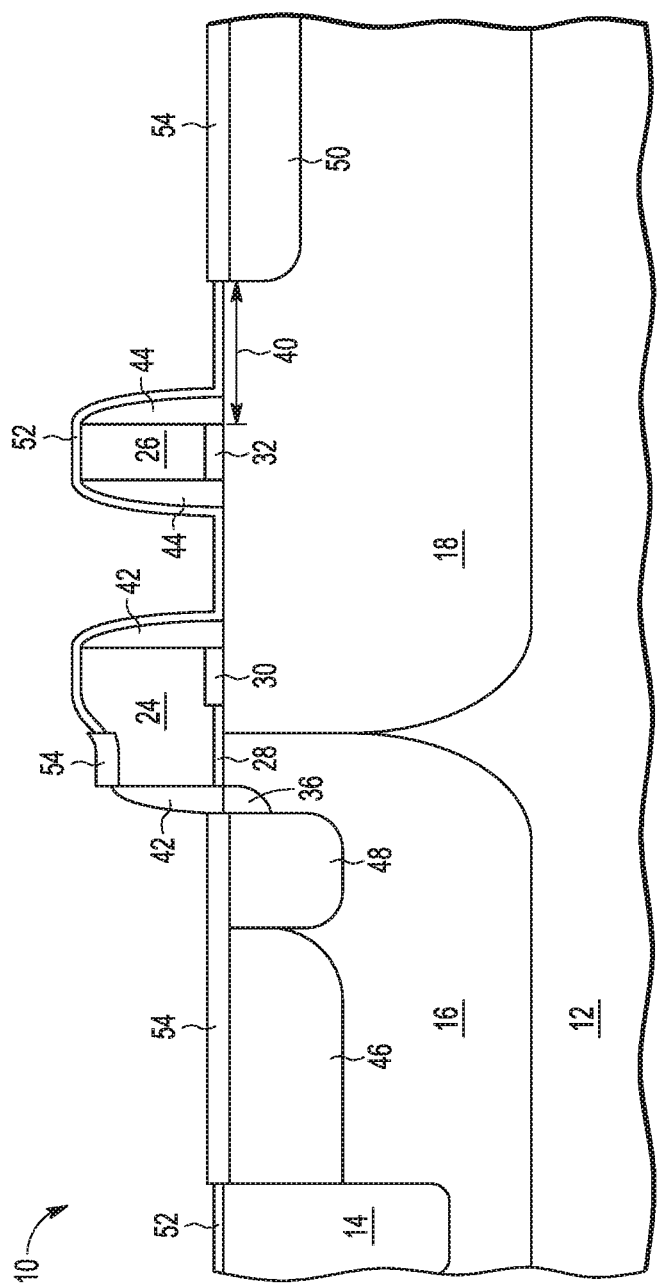

FIG. 8 illustrates a cross-sectional view of semiconductor device 10 at a subsequent stage in processing. A silicide process is performed to form a silicide 54 on substrate 12 over doped regions 46 and 48, the exposed part of gate structure 24, and on substrate 12 over doped region 50.

Figure 9:
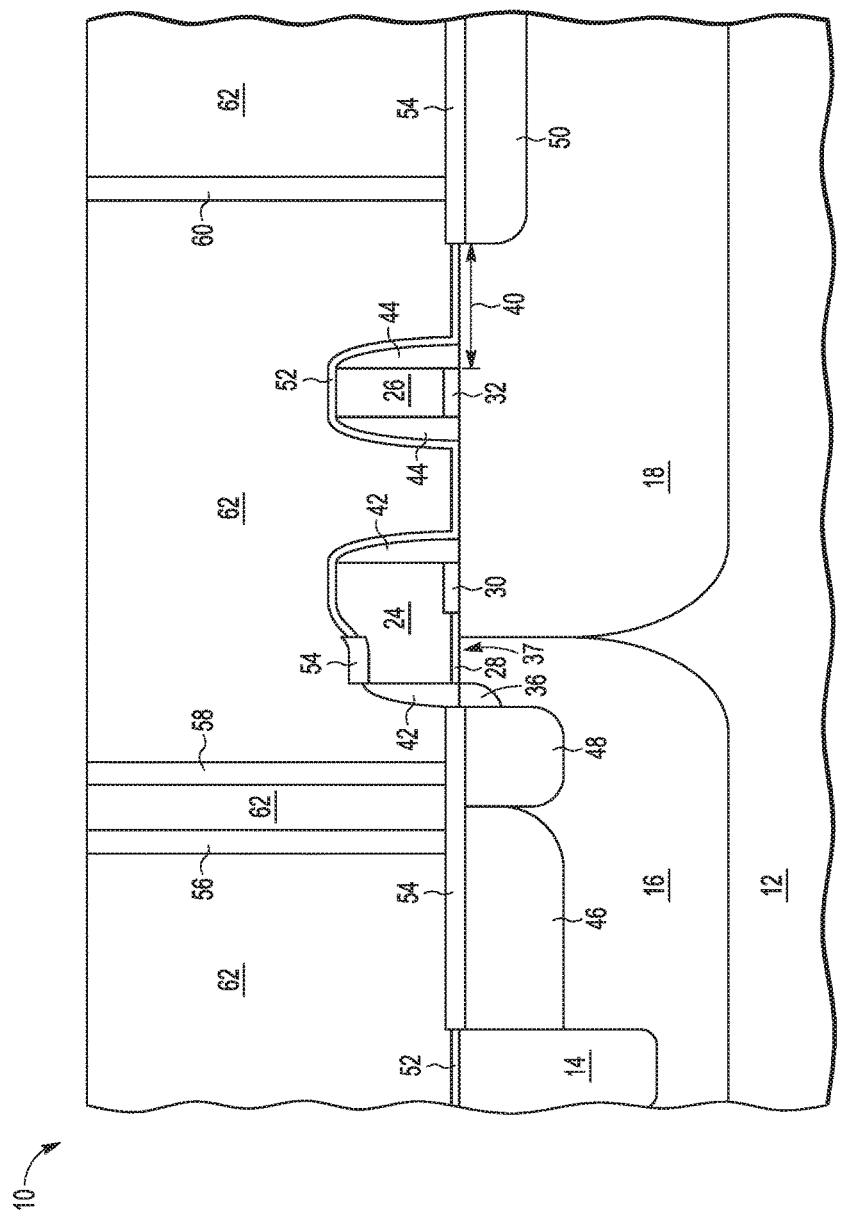

FIG. 9 illustrates a cross-sectional view of semiconductor device 10 at a subsequent stage in processing. An interlayer dielectric layer (ILD) 62 is formed over substrate 12 and a body contact 56, source contact 58, and drain contact 60 is formed. Source contact 58 provides a contact to source region 48 and 36, body contact 56 provides a contact to the body of device 10 via doped region 46, and drain contact 60 provides a contact to drain region 50. The silicide portion on gate structure 24 may be used to provide a gate contact to gate structure 24, if desired.

In one embodiment, gate structure 24 corresponds to a primary gate of device 10 and gate structure 26 to a secondary gate of device 10. The gate dielectric of the primary gate varies in thickness from under the source side to under the opposite side of gate structure 24. The thinner portion of the gate dielectric of gate structure 24, dielectric layer 28, allows for an ultra-short channel region 37 between well 18 and source region 36/48 which preserves a good property of a logic transistor (e.g. good RF performance). Note that the channel length of device 10 depends on how far well 18 extends under gate structure 24. Note also that the thinner portion of the gate dielectric is formed over channel region 37. The secondary gate (gate structure 26) which is formed over well 18 and spaced apart from gate structure 24 and spaced apart from drain region 50 can be used to help shape the electrical field. These gate structures 24 and 26 fulfill the same function as a single contiguous long gate, but since they are divided, they allow for improved hot carrier injection. Also, the combined length of gate structures 24 and 26 is shorter as compared to a single contiguous long gate, which reduces the gate-input and overlap (gate-drain) capacitance. This may also allow for preserving good RF behavior. Furthermore, since the secondary gate is over the thicker gate dielectric (dielectric layer 32), the parasitic capacitance to the drain is reduced. The secondary gate can either be left floating, be electrically connected to the primary gate, be independently biased, or be electrically connected to the source of device 10. The choice of how to connect the secondary gate is drive by a trade-off between robustness, design flexibility, and RF performance.

Figure 10:
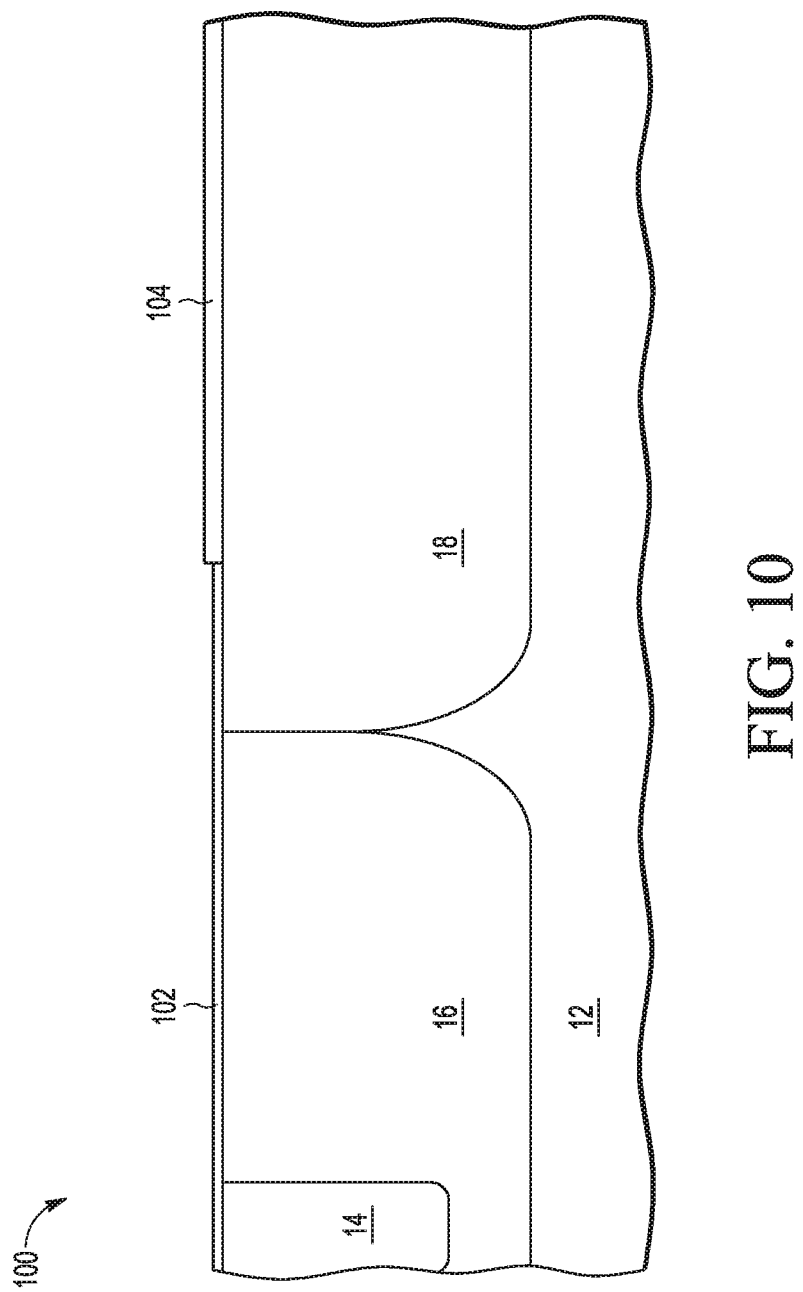
FIGS. 10-15 illustrate, in cross-section form, a semiconductor device at various processing stages, in accordance with another embodiment of the present invention.

FIGS. 10-15 provide for an alternate embodiment in which the gate dielectric of the primary gate and secondary gate have different thicknesses but the gate dielectric of the primary gate does not vary in thickness. Note that the same reference numerals indicate like elements. Therefore, FIG. 10 illustrates a cross-sectional view of a semiconductor device 100 which includes substrate 10 having isolation region 14, and wells 16 and 18. Dielectric layers 102 and 104 are formed over substrate 12. Dielectric layers 102 and 104 may be oxides, and may be grown or deposited, or combinations thereof. An intermediate patterning step is applied to ensure that dielectric layer 102 extends over well 16 and a portion of well 18, such that dielectric layer 102 meets dielectric layer 104 over well 18, spaced apart from the end of well 16. Dielectric layer 104 is thicker than dielectric layer 102. Any suitable methods may be used to form layers 102 and 104, in which the formation of either of these layers may include the formation of multiple layers, either by growth or deposition.

Figure 11:
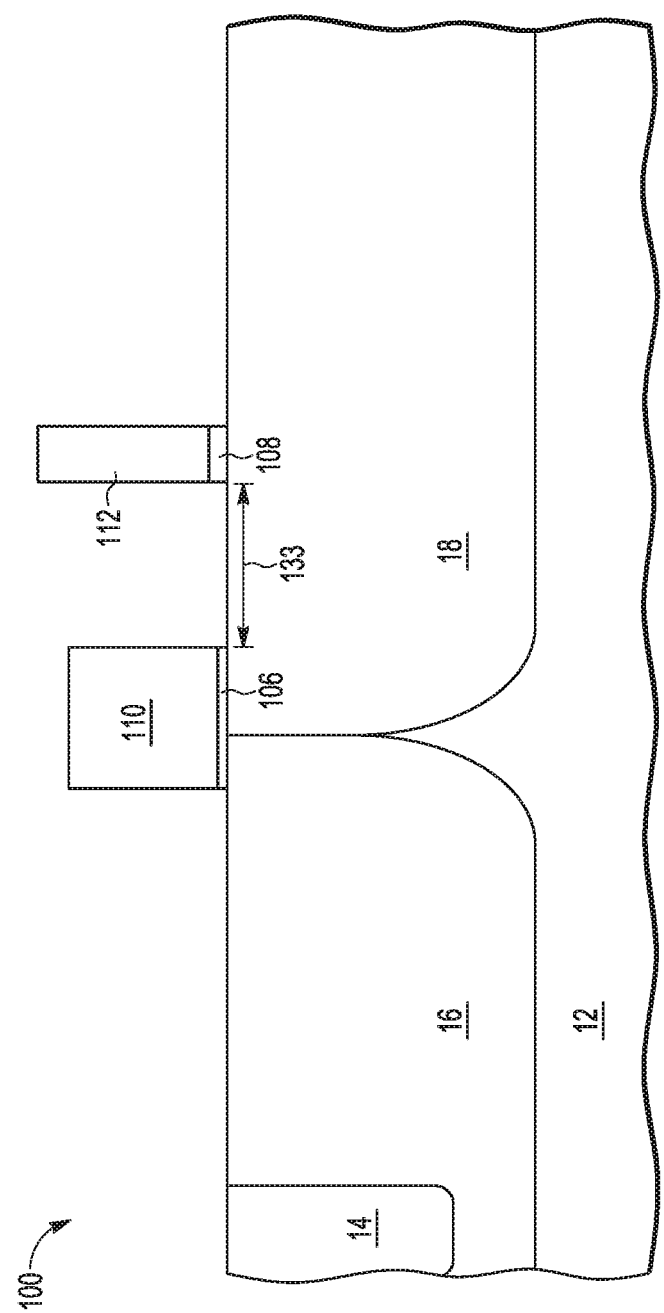

FIG. 11 illustrates a cross-sectional view of semiconductor device 100 at a subsequent stage in processing. A gate layer is deposited over substrate 12 and pattered to form conductive gate structures 110 and 112. When portions of the gate layer are removed to form conductive gate structure 110 and 112, portions of dielectric layers 102 and 104 not under gate structures 110 and 112 are also removed. In this manner, a portion of dielectric layer 102, referred to as gate dielectric layer 106, remains between gate structure 110 and substrate 12. Note that gate dielectric layer 106 forms a contiguous gate dielectric layer that does not vary in thickness between gate structure 110 and substrate 12. A portion of dielectric layer 104, referred to as gate dielectric layer 108, remains between gate structure 112 and substrate 12. Gate dielectric layer 108 is thicker than gate dielectric layer 106 since it is formed from dielectric layer 104. Gate structure 112 is physically separate and spaced apart from gate structure 110 by a distance 133 and is located entirely over well 18. In contrast, gate structure 110 is located over both wells 16 and 18. In one embodiment, distance 133 is in range of 100 to 500 nanometers.

Figure 12:
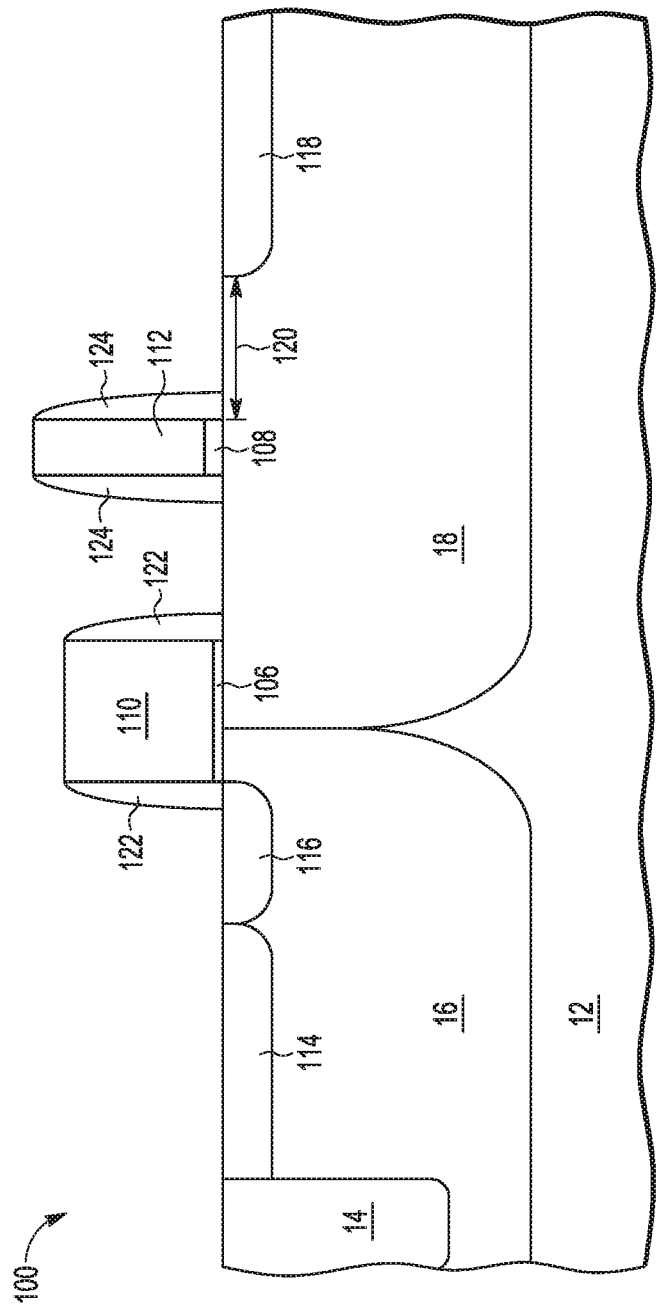

FIG. 12 illustrates a cross-sectional view of semiconductor device 100 at a subsequent stage in processing. Shallow implants are performed into substrate 12 to form doped regions 114 and 116 in well 16 and doped region 118 in well 18. In one embodiment, region 114 is a heavily doped P+ region, and regions 116 and 118 are heavily doped N+ regions. That is, region 114 has a greater doping level than well 16, and regions 116 and 118 have a greater doping level than well 18. Regions 114, 116, and 118 can be formed using, for example, lightly-doped-drain (LDD) implants or a combination of LDD implants with opposite doping-type implants. Note that a patterned masking layer is used for the implants to form region 114 and to form regions 116 and 118 in the desired locations. Regions 116 and 118 may be formed before or after the formation of region 114. Region 118 is laterally spaced from gate structure 112 by a distance 120. In one embodiment, distance 120 is in a range of 100 to 1000 nanometers. A spacer 122 is formed around gate structure 110 and a spacer 124 is formed around gate structure 112. Note that distance 120 can be obtained in any suitable way, such as, for example, by mask design and lithography definition, or by providing "hardmasks" such as additional dielectric spacers adjacent gate structure 108. In an alternate embodiment, regions 114 and 118 are not present.

Figure 13:
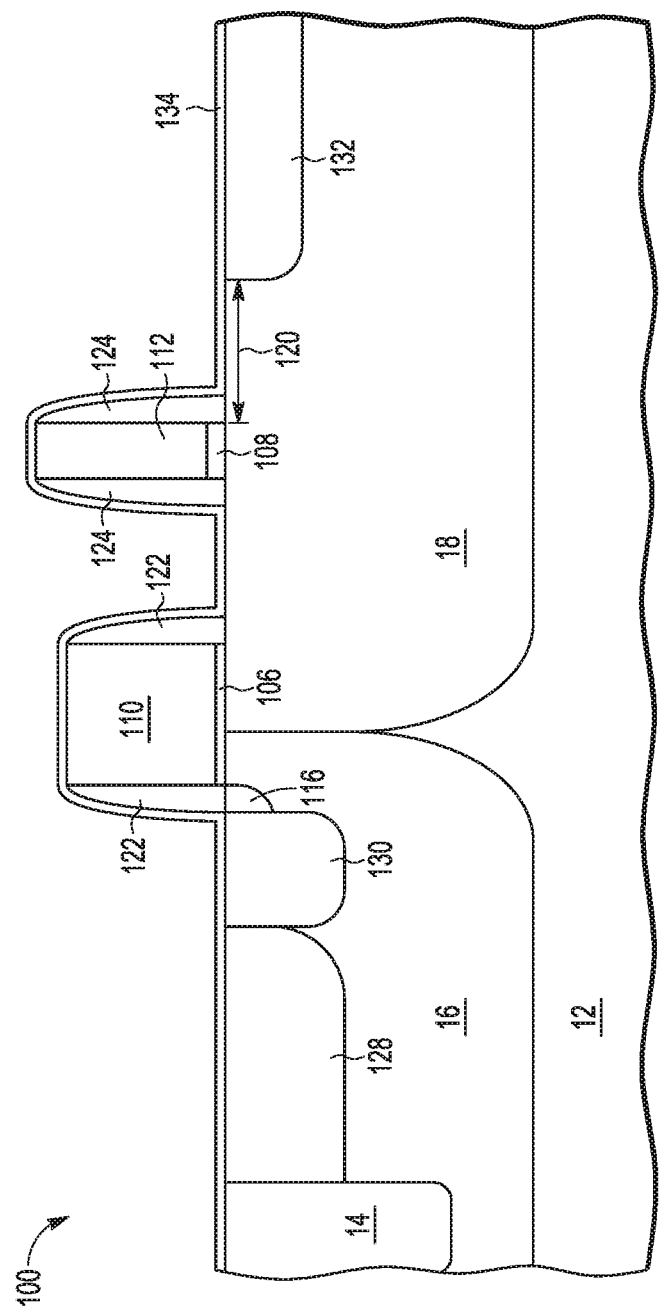

FIG. 13 illustrates a cross-sectional view of semiconductor device 100 at a subsequent stage in processing. Further implants are performed into substrate 12 to form doped regions 128, 130, and 132. Doped region 128 is formed at the same location as region 114 but extends further into substrate 12 and is a heavily doped P++ region (more heavily doped than region 114). Doped region 130 is formed at the same location as region 116 but adjacent spacer 122, therefore a portion of region 116 under spacer 122 remains. That is, spacer 122 masks the implant during formation of region 130. Also, region 130 extends further into substrate 12 than region 116 and is a heavily doped N++ region (more heavily doped than region 116). Doped region 132 is formed at the same location as region 118 but extends further into substrate 12 and is a heavily doped N++ region (more heavily doped than region 118). Doped regions 130 and 116 correspond to a source region of device 100 and doped region 132 to a drain region of device 100. Doped region 128 corresponds to the body of device 100. In one embodiment, a portion of gate structure 110, such as only the source side portion of gate structure 110 is heavily doped to N+. As with regions 114, 116, and 118, a patterned masking layer is used for the implants to form the doped regions in the desired locations. A dielectric layer 134 is formed over substrate 12 and gate structures 110 and 112. In one embodiment, dielectric layer 134 is an insulator, such as oxide, and is blanket deposited over substrate 12.

Figure 14:
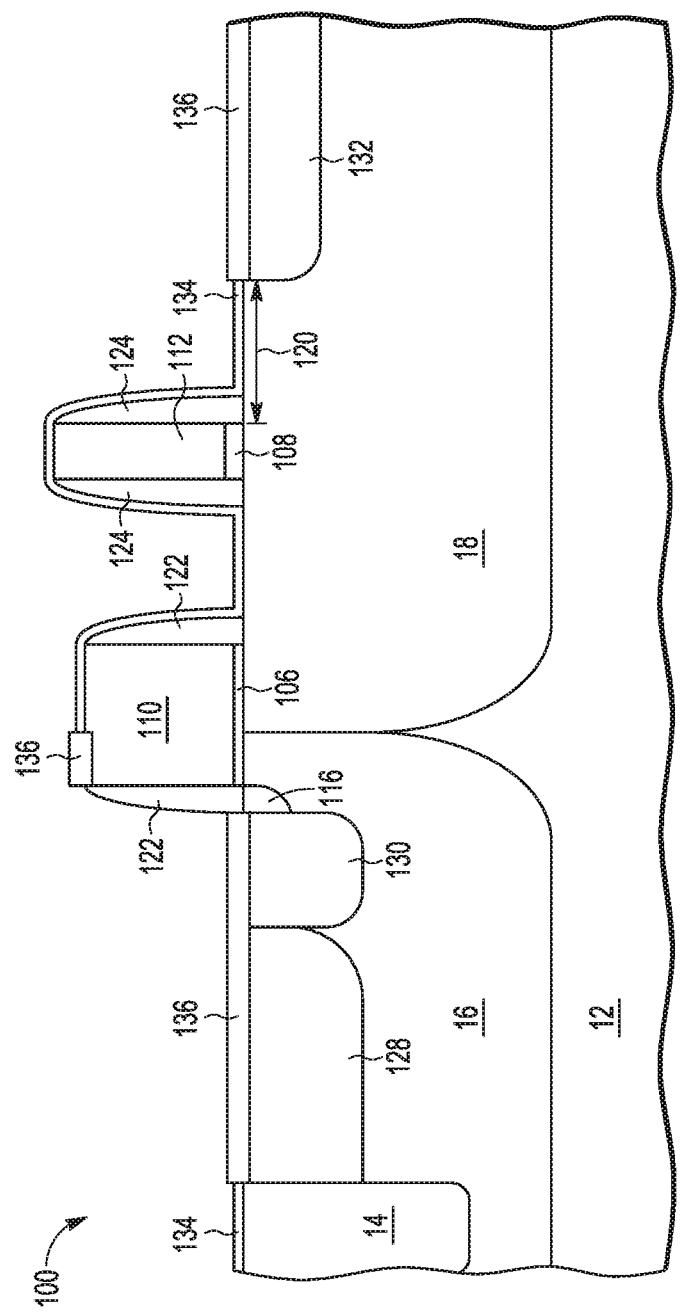

FIG. 14 illustrates a cross-sectional view of semiconductor device 100 at a subsequent stage in processing. Dielectric layer 134 is patterned to remove portions from locations where a silicide layer is desired. Therefore, portions of dielectric layer 134 are removed from over doped regions 128 and 130, part of spacer 122 and part of gate structure 110 (on the source side), and from over doped region 132, leaving dielectric layer 134 over isolation region 14, part of gate structure 110 and spacer 122, substrate 12 between gate structures 110 and 112, spacer 124, gate structure 112, and substrate 12 between spacer 124 and doped region 132. A silicide process is then performed to form a silicide 136 on substrate 12 over doped regions 128 and 130, the exposed part of gate structure 110, and on substrate 12 over doped region 132.

Figure 15:
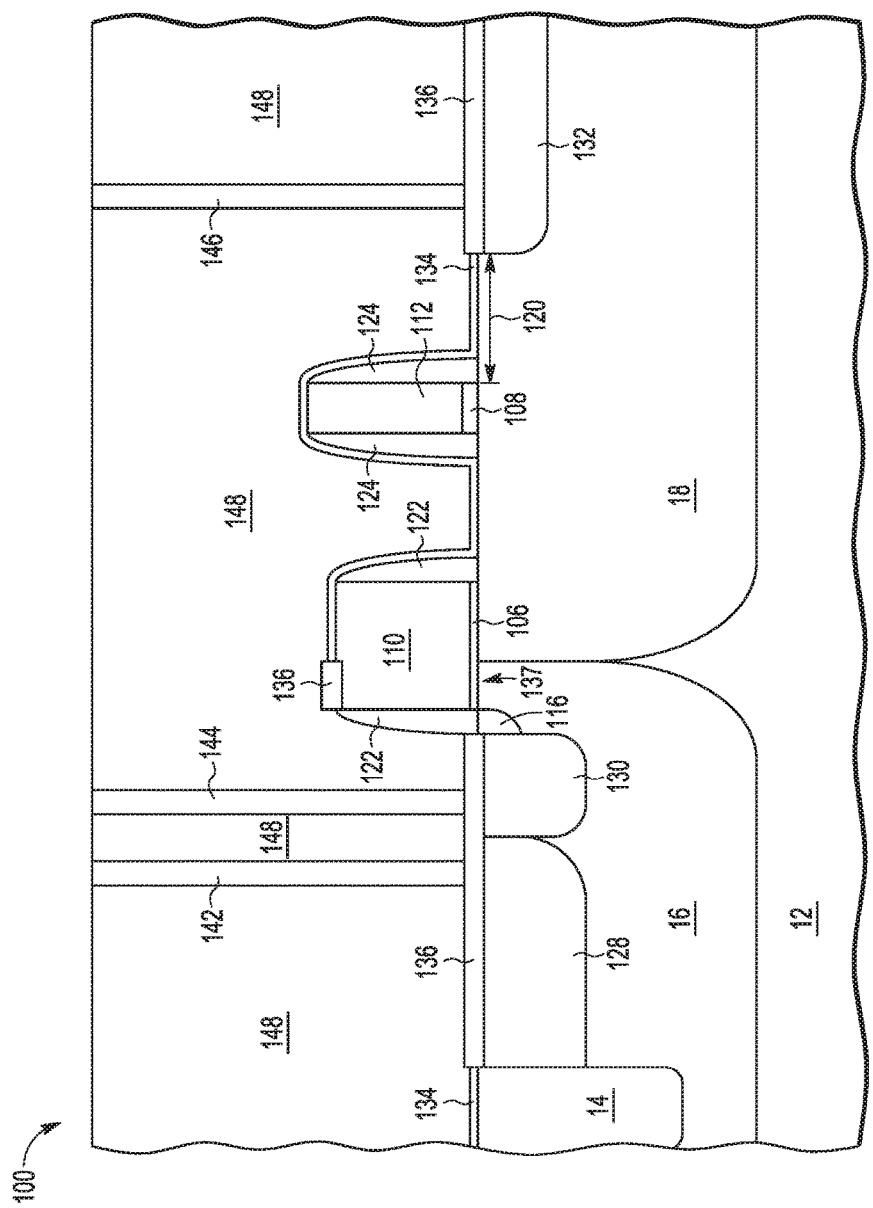

FIG. 15 illustrates a cross-sectional view of semiconductor device 100 at a subsequent stage in processing. An interlayer dielectric layer (ILD) 148 is formed over substrate 12 and a body contact 142, source contact 144, and drain contact 146 is formed. Source contact 144 provides a contact to source region 130 and 116, body contact 142 provides a contact to the body of device 100 via doped region 128, and drain contact 146 provides a contact to drain region 132. The silicide portion on gate structure 110 may be used to provide a gate contact to gate structure 110, if desired.

As in the above embodiment of device 10, in the current embodiment, gate structure 110 corresponds to a primary gate of device 100 and gate structure 112 to a secondary gate of device 100. Well 18 extending under gate structure 110 also allows for an ultra-short channel region 137 between well 18 and source region 130/116 which preserves a good property of a logic transistor (e.g. good RF performance). Note that the channel length of device 100 depends on how far well 18 extends under gate structure 110 because the channel length is defined as the overlap of region 110 over well 16. The secondary gate (gate structure 112) which is formed over well 18 and spaced apart from gate structure 110 and spaced apart from drain region 132 can be used to help shape the electrical field. These gate structures 110 and 112 fulfill the same function as a single contiguous long gate, but since they are divided, they allow for improved hot carrier injection. Also, the combined length of gate structures 110 and 112 is shorter as compared to a single contiguous long gate, which reduces the gate-input and overlap (gate-drain) capacitance. This may also allow for preserving good RF behavior. Furthermore, since the secondary gate is over the thicker gate dielectric (dielectric layer 108), the parasitic capacitance to the drain is reduced. The secondary gate can either be left floating, be electrically connected to the primary gate, be independently biased, or be electrically connected to the source of device 100. The choice of how to connect the secondary gate is drive by a trade-off between robustness and RF performance.

Now it can be appreciated how a semiconductor device with an extended drain region (e.g. well 18 which extends under the primary gate structure) and dual gate dielectrics of different thicknesses may allow for improved performance, such as in an RF application. In this manner, the favorable properties of a logic transistor can be maintained while allowing an extended operating voltage and high current density.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, devices 10 and 100 can be manufactured as P-channel devices rather than N-channel devices in which the polarities and conductivity types are appropriately reversed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes a first dielectric layer on a substrate, the first dielectric layer including a first dielectric portion over a first doped well region of a first conductivity type and a second dielectric portion over a second doped well region of a second conductivity type; a second dielectric layer on the substrate directly adjacent the first dielectric layer, wherein the second dielectric layer is over the second doped well region; a first conductive gate structure over the first and second dielectric layers; a third dielectric layer on the substrate over the second doped well region and separated a first distance from the second dielectric layer; a second conductive gate structure over the third dielectric layer; and a third doped region implanted in the second doped well region a second distance from the third dielectric layer and the second conductive gate structure, the third doped region having the second conductivity type. In one aspect, the second and third dielectric layers are thicker than the first dielectric layer. In another aspect, the semiconductor device further includes a fourth doped region implanted in the first doped well region adjacent the first portion of the first dielectric layer, the fourth doped region having the second conductivity type. In a further aspect, the semiconductor device further includes a fifth doped region implanted in the first doped well region adjacent the fourth doped region, the fifth doped region having the first conductivity type. In another further aspect, doping levels of the third and fourth doped regions are greater than a doping level of the second doped well region. In another further aspect, a doping level of the fifth dope region is greater than a doping level of the first doped well region. In yet another aspect, the semiconductor device is a transistor and the second conductive gate structure is one of the group consisting of: floating, connected to the first conductive gate structure, independently biased, and connected to a source terminal in a periphery of the semiconductor device. In another aspect, the first distance is between 100 and 500 nanometers, and the second distance is between 100 and 1000 nanometers. In a further aspect, the semiconductor device further includes a first conductive contact on the third doped region; a second conductive contact on the fourth doped region. In another further aspect, the semiconductor device further includes a fourth dielectric layer over a portion of the first conductive gate structure, the second conductive gate structure, the first distance and the second distance; and a silicide layer over the third, fourth and fifth doped regions.

In another embodiment, a method of making a semiconductor transistor includes forming a first dielectric layer over a first well region and a portion of a second well region, wherein the first and second well regions are directly adjacent one another in a substrate, the first well region has a first polarity, and the second well region has a second polarity; depositing a second dielectric layer over the second well region adjacent to the first dielectric layer, wherein the second dielectric layer is thicker than the first dielectric layer, and the second dielectric layer is separated from the first dielectric layer by a first distance; forming a first gate structure including a conductive material over the first dielectric layer; forming a second gate structure including a conductive material over the second dielectric layer; forming a first doped region of the second polarity in the second well region, wherein the first doped region is adjacent to the second dielectric layer, and the first doped region is separated from the second dielectric layer by a second distance. In one aspect, the method further includes forming a second doped region of the second polarity in the first well region, wherein the second doped region is adjacent the first dielectric layer. In a further aspect, the method further includes forming a third doped region of the first polarity in the first well region, wherein the third doped region is directly adjacent the second doped region. In another aspect, the second distance is between 100 and 1000 nanometers. In another aspect, the method further includes siliciding a first portion of the first gate structure; and depositing a dielectric material over a second portion of the first gate structure and the second gate structure. In a further aspect, the method further includes siliciding the first doped region and the second doped region. In another further aspect, the method further includes depositing the dielectric material over the second distance. In another aspect, the second gate structure is connected to the first gate structure or the second doped region.

In yet another embodiment, a semiconductor transistor includes a first well region of a first polarity in a substrate; a second well region of a second polarity in the substrate adjacent the first well region; a first gate oxide on a portion of the first well region and a portion of the second well region; a first gate structure on the first gate oxide; a second gate oxide on another portion of the second well region; a second gate structure on the second gate oxide; a first source/drain implant in the first well region adjacent the first gate oxide; a second source/drain implant in the second well region adjacent the second gate oxide, wherein the second source/drain implant is separated from the second date oxide by a first distance, and the first gate structure is separated from the second gate structure by a second distance. In one aspect, the semiconductor transistor further includes a first portion of the first gate structure is silicided and a second portion of the first gate structure is covered with dielectric material.

What is claimed is:

1. A semiconductor device comprising:
a first dielectric layer on a substrate, the first dielectric layer including a first dielectric portion over a first doped well region of a first conductivity type and a second dielectric portion over a second doped well region of a second conductivity type;
a second dielectric layer on the substrate directly adjacent the first dielectric layer, wherein the second dielectric layer is over the second doped well region;
a first conductive gate structure over the first and second dielectric layers;
a third dielectric layer on the substrate over the second doped well region and separated a first distance from the second dielectric layer;
a second conductive gate structure over the third dielectric layer; and
a third doped region implanted in the second doped well region a second distance from the third dielectric layer and the second conductive gate structure, the third doped region having the second conductivity type, wherein the second distance is between 100 and 1000 nanometers.

2. The semiconductor device of claim 1 wherein:
the second and third dielectric layers are thicker than the first dielectric layer.

3. The semiconductor device of claim 1 further comprising:
a fourth doped region implanted in the first doped well region adjacent the first portion of the first dielectric layer, the fourth doped region having the second conductivity type.

4. The semiconductor device of claim 3 further comprising:
a fifth doped region implanted in the first doped well region adjacent the fourth doped region, the fifth doped region having the first conductivity type.

5. The semiconductor device of claim 4 wherein:
a doping level of the fifth dope region is greater than a doping level of the first doped well region.

6. The semiconductor device of claim 3 wherein:
doping levels of the third and fourth doped regions are greater than a doping level of the second doped well region.

7. The semiconductor device of claim 3 further comprising:
a first conductive contact on the third doped region;
a second conductive contact on the fourth doped region.

8. The semiconductor device of claim 1 wherein:
the semiconductor device is a transistor and the second conductive gate structure is one of the group consisting of: floating, connected to the first conductive gate structure, independently biased, and connected to a source terminal in a periphery of the semiconductor device.

9. The semiconductor device of claim 1 wherein:
the first distance is between 100 and 500 nanometers.

10. A semiconductor device comprising:
a first dielectric layer on a substrate, the first dielectric layer including a first dielectric portion over a first doped well region of a first conductivity type and a second dielectric portion over a second doped well region of a second conductivity type;
a second dielectric layer on the substrate directly adjacent the first dielectric layer, wherein the second dielectric layer is over the second doped well region;
a first conductive gate structure over the first and second dielectric layers;
a third dielectric layer on the substrate over the second doped well region and separated a first distance from the second dielectric layer;
a second conductive gate structure over the third dielectric layer;
a third doped region implanted in the second doped well region a second distance from the third dielectric layer and the second conductive gate structure, the third doped region having the second conductivity type;
a fourth doped region implanted in the first doped well region adjacent the first portion of the first dielectric layer, the fourth doped region having the second conductivity type;
a fifth doped region implanted in the first doped well region adjacent the fourth doped region, the fifth doped region having the first conductivity type;
a fourth dielectric layer over a portion of the first conductive gate structure, the second conductive gate structure, the first distance and the second distance; and
a silicide layer over the third, fourth and fifth doped regions.

11. A method of making a semiconductor transistor comprising:
forming a first dielectric layer over a first well region and a portion of a second well region, wherein
the first and second well regions are directly adjacent one another in a substrate,
the first well region has a first polarity, and
the second well region has a second polarity;
depositing a second dielectric layer over the second well region adjacent to the first dielectric layer, wherein
the second dielectric layer is thicker than the first dielectric layer, and
the second dielectric layer is separated from the first dielectric layer by a first distance;
forming a first gate structure including a conductive material over the first dielectric layer;
forming a second gate structure including a conductive material over the second dielectric layer;
forming a first doped region of the second polarity in the second well region, wherein
the first doped region is adjacent to the second dielectric layer,
the first doped region is separated from the second dielectric layer by a second distance, and
the second distance is between 100 and 1000 nanometers.

12. The method of claim 11 further comprising:
forming a second doped region of the second polarity in the first well region, wherein the second doped region is adjacent the first dielectric layer.

13. The method of claim 12 further comprising:
forming a third doped region of the first polarity in the first well region, wherein the third doped region is directly adjacent the second doped region.

14. The method of claim 11 further comprising:
siliciding a first portion of the first gate structure; and
depositing a dielectric material over a second portion of the first gate structure and the second gate structure.

15. The method of claim 14 further comprising:
siliciding the first doped region and the second doped region.

16. The method of claim 11 wherein the second gate structure is connected to the first gate structure or the second doped region.

17. A method of making a semiconductor transistor comprising:
- forming a first dielectric layer over a first well region and a portion of a second well region, wherein
  - the first and second well regions are directly adjacent one another in a substrate,
  - the first well region has a first polarity, and
  - the second well region has a second polarity;
- depositing a second dielectric layer over the second well region adjacent to the first dielectric layer, wherein
  - the second dielectric layer is thicker than the first dielectric layer, and
  - the second dielectric layer is separated from the first dielectric layer by a first distance;
- forming a first gate structure including a conductive material over the first dielectric layer;
- forming a second gate structure including a conductive material over the second dielectric layer;
- forming a first doped region of the second polarity in the second well region, wherein
  - the first doped region is adjacent to the second dielectric layer, and
  - the first doped region is separated from the second dielectric layer by a second distance;
- siliciding a first portion of the first gate structure;
- depositing a dielectric material over a second portion of the first gate structure and the second gate structure; and
- depositing the dielectric material over the second distance.

18. A semiconductor transistor comprising:
- a first well region of a first polarity in a substrate;
- a second well region of a second polarity in the substrate adjacent the first well region;
- a first gate oxide on a portion of the first well region and a portion of the second well region;
- a first gate structure on the first gate oxide;
- a second gate oxide on another portion of the second well region;
- a second gate structure on the second gate oxide;
- a first source/drain implant in the first well region adjacent the first gate oxide;
- a second source/drain implant in the second well region adjacent the second gate oxide, wherein
  - the second source/drain implant is separated from the second date oxide by a first distance, and
  - the first gate structure is separated from the second gate structure by a second distance; and
- a first portion of the first gate structure is silicided and a second portion of the first gate structure is covered with dielectric material.

* * * * *